United States Patent
Jang

(10) Patent No.: US 11,908,540 B2
(45) Date of Patent: Feb. 20, 2024

(54) SEMICONDUCTOR SYSTEM AND OPERATING METHOD TO ADJUST TEMPERATURE OF SEMICONDUCTOR APPARATUS AND CONTROL DEVICE

(71) Applicant: SK hynix Inc., Icheon-si (KR)

(72) Inventor: In Jong Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/646,439

(22) Filed: Dec. 29, 2021

(65) Prior Publication Data
US 2023/0108818 A1  Apr. 6, 2023

(30) Foreign Application Priority Data
Sep. 24, 2021 (KR) .................. 10-2021-0126510

(51) Int. Cl.
*G11C 7/04* (2006.01)
*G11C 11/406* (2006.01)

(52) U.S. Cl.
CPC .......... *G11C 7/04* (2013.01); *G11C 11/40615* (2013.01); *G11C 11/40626* (2013.01)

(58) Field of Classification Search
CPC ................ G11C 7/04; G11C 11/40615; G11C 11/40626
See application file for complete search history.

(56) References Cited

U.S. PATENT DOCUMENTS

2016/0064063 A1* 3/2016 Nomura ............ G11C 11/40618
365/189.011
2018/0061504 A1* 3/2018 Kim .................. G11C 7/04

FOREIGN PATENT DOCUMENTS

KR 1020190012771 A 2/2019
KR 1020200126533 A 11/2020
WO WO-2016107136 A1 * 7/2016 .......... H01M 10/486

OTHER PUBLICATIONS

Battery Protection Method, System and Device, and Unmanned Aerial Vehicle (Year: 2016).*

* cited by examiner

*Primary Examiner* — Sultana Begum
(74) *Attorney, Agent, or Firm* — Weaver Austin Villeneuve & Sampson LLP

(57) ABSTRACT

A semiconductor system includes a semiconductor apparatus and a control device. The semiconductor apparatus performs a preset operation in response to a command signal. The control device controls a temperature adjustment operation so that first temperature information and second temperature information correspond to each other.

20 Claims, 7 Drawing Sheets (A1)

(A2)

(B1)

(B2)

(C1)

(C2)

(D1)

(D2)

SEMICONDUCTOR SYSTEM AND OPERATING METHOD TO ADJUST TEMPERATURE OF SEMICONDUCTOR APPARATUS AND CONTROL DEVICE

CROSS-REFERENCES TO RELATED APPLICATION

The present application claims priority under 35 U.S.C. § 119(a) to Korean application number 10-2021-0126510, filed on Sep. 24, 2021, in the Korean Intellectual Property Office, which is incorporated herein by reference in its entirety.

BACKGROUND

1. Technical Field

Various embodiments generally relate to a semiconductor system and an operating method thereof, and more particularly, to semiconductor system that performs a preset operation according to temperature information and an operating method thereof.

2. Related Art

In general, a semiconductor memory apparatus is roughly classified into a volatile memory apparatus and a nonvolatile memory apparatus. Examples of the volatile memory apparatus may include a static RAM (SRAM), a dynamic RAM (DRAM), a synchronous DRAM (SDRAM), and the like. The volatile memory apparatus has a characteristic that stored data therein is lost when power is off, but the degree of integration of memory cells storing data is generally high and an operating speed is generally high. Examples of the nonvolatile memory apparatus may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The nonvolatile memory apparatus has a characteristic that stored data is retained even though power is off, but the degree of integration is generally low and an operating speed is generally low as compared to the volatile memory apparatus.

Recently, as process technology and design technology have advanced, a semiconductor memory apparatus and a control device for controlling the same are designed as a single chip having a small area. In other words, the semiconductor memory apparatus and the control device are designed to be composed of a single semiconductor system. Furthermore, the semiconductor system is designed to be composed of not only a semiconductor memory apparatus but also a is semiconductor apparatus that performs various functions and a control device for controlling the same.

As described above, the semiconductor system includes various types of semiconductor apparatuses as well as the control device. The control device and the semiconductor apparatus have different temperatures depending on operation conditions.

For example, ideally, a plurality of semiconductor memory apparatuses provided in the semiconductor system may have substantially the same temperature because they perform an interleaving operation. However, the plurality of semiconductor memory apparatuses may more likely have different temperatures. In addition, the control device also has a temperature difference from that of each of the plurality of semiconductor memory apparatuses. The temperature difference between the control device and each of the plurality of semiconductor memory apparatuses can cause an abnormal operation of the semiconductor system or reduce the operation efficiency thereof.

SUMMARY

A semiconductor system according to an embodiment of the present disclosure may include: a semiconductor apparatus operable to perform a preset operation in response to a command signal; and a control device operable to control a temperature adjustment operation for at least one of the control device or the semiconductor apparatus on the basis of first temperature information of the semiconductor apparatus and second temperature information of the control device so that the first temperature information and the second temperature information correspond to each other.

An operating method of a semiconductor system according to an embodiment of the present disclosure may include: a step of detecting temperature information of a semiconductor apparatus and temperature information of a control device; a step of comparing the temperature information of the semiconductor apparatus and the temperature information of the control device; and a step of performing a temperature adjustment operation on at least one of the semiconductor apparatus or the control device so that an actual temperature of the semiconductor apparatus and an actual temperature of the control device correspond to each other.

DETAILED DESCRIPTION

Figure 1:
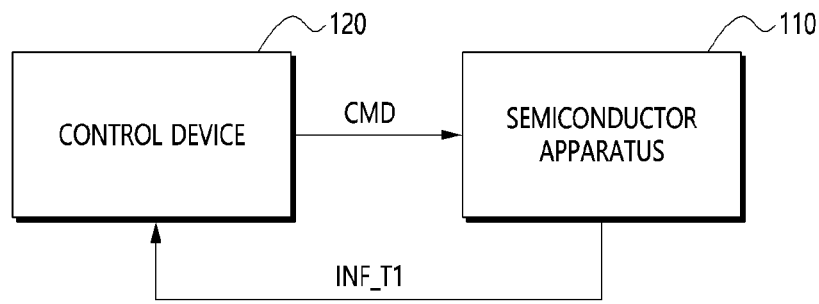
FIG. 1 is a block diagram illustrating an example of a configuration of a semiconductor system in accordance with an embodiment of the present disclosure.

The description of the present disclosure includes structural and/or functional description of various implementations. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as "first" and "second," are used to distinguish one element from another element, and the scope of the present disclosure should not be limited by the terms. For example, a first element may be referred to as a second element. Likewise, the second element may be referred to as the first element.

An expression of the singular number should be understood as including plural expressions, unless clearly expressed otherwise in the context. Terms such as "include" or "have" should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in a different order than the described order.

All the terms used herein, including technological or scientific terms, have the same meanings as those that are typically understood by those skilled in the art, unless otherwise defined. Terms defined in commonly used dictionaries should be construed as having the same meanings as those in the context in related technology and should not be construed as having ideal or excessively formal meanings, unless clearly defined in the application.

Various embodiments are directed to providing a semiconductor system capable of controlling the temperature of each of a control device and a semiconductor apparatus of a semiconductor system, by additionally performing a temperature adjustment operation according to temperature information, and an operating method thereof.

An embodiment of the present disclosure has an effect capable of substantially preventing an abnormal operation caused by a temperature difference and minimizing a decrease in operation efficiency by controlling the temperature of each of a control device and a semiconductor apparatus of a semiconductor system.

FIG. 1 is a block diagram illustrating an example of a configuration of a semiconductor system 100 in accordance with an embodiment of the present disclosure.

Referring to FIG. 1, the semiconductor system 100 may include a semiconductor apparatus 110 and a control device 120.

First, the semiconductor apparatus 110 may be operable to perform a preset operation in response to a command signal CMD. The semiconductor apparatus 110 may be an internal circuit provided in the semiconductor system 100, and may include, for example, a semiconductor memory apparatus and the like. When the semiconductor apparatus 110 is an internal circuit, the preset operation may include an activation operation, a deactivation operation, or the like for the internal circuit. Furthermore, when the semiconductor apparatus 110 is a semiconductor memory apparatus, the preset operation may include a read operation or the like for the semiconductor memory apparatus. Furthermore, the preset operation of the semiconductor memory apparatus may also include an activation operation to perform the read operation and/or a deactivation operation to disable the read operation. The read operation may be an operation for outputting data stored in the semiconductor memory apparatus. As will be described below, the semiconductor apparatus 110 may increase or decrease its own actual temperature through the preset operation.

Next, the control device 120 may be operable to control a temperature adjustment operation for at least one of the control device 120 and the semiconductor apparatus 110 on the basis of first temperature information INF_T1 of the semiconductor apparatus 110 and second temperature information INF_T2 (see FIG. 3) of the control device 120. The temperature adjustment operation may be an operation for increasing or decreasing the actual temperature of at least one of the control device 120 and the semiconductor apparatus 110 through a preset operation. The preset operation of the control device 120 may include an input driving operation, an output driving operation, and the like. Furthermore, the preset operation of the control device 120 may include an activation operation to perform the input driving operation and/or the output driving operation, and a deactivation operation to disable the input driving operation and/or the output driving operation. The input driving operation may be an operation in which an input circuit provided in the control device 120 is driven during the read operation. The output driving operation may be an operation in which an output circuit provided in the control device 120 is driven during a write operation. As will be described below, the control device 120 may increase or decrease its own actual temperature through the preset operation.

Then, the control device 120 may increase or decrease the actual temperature of the semiconductor apparatus 110 and/or the control device 120 by controlling the temperature adjustment operation for the semiconductor apparatus 110 and/or the control device 120. In other words, the control device 120 may control the actual temperature of the semiconductor apparatus 110 and the actual temperature of the control device 120 to correspond to each other on the basis of the temperature adjustment operation. The actual temperature of the semiconductor apparatus 110 may correspond to the first temperature information INF_T1, and the actual temperature of the control device 120 may correspond to the second temperature information INF_T2. Accordingly, the control device 120 may control the first temperature information INF_T1 and/or the second temperature information INF_T2 such that they correspond to each other through the temperature adjustment operation of the control device 120 and/or the semiconductor apparatus 110.

The temperature adjustment operation of the semiconductor system 100 in accordance with an embodiment of the present disclosure will be described below.

When the temperature of the semiconductor apparatus 110 is low, the control device 120 may control the semiconductor apparatus 110 to perform, for example, an activation operation, through the command signal CMD. Accordingly, the actual temperature of the semiconductor apparatus 110 may be increased. When the temperature of the semiconductor apparatus 110 is high, the control device 120 may control the semiconductor apparatus 110 to perform a deactivation operation, through the command signal CMD. Accordingly, the actual temperature of the semiconductor apparatus 110 may be decreased.

Furthermore, when the temperature of the control device 120 is low, the control device 120 may control the control device 120 to perform an activation operation, for example. Accordingly, the actual temperature of the control device 120 may be increased. Furthermore, when the temperature of the control device 120 is high, the control device 120 may control the control device 120 to perform a deactivation operation. Accordingly, the actual temperature of the control device 120 may be decreased.

In brief, the semiconductor system 100 may control the temperature adjustment operation of the semiconductor apparatus 110 and/or the control device 120 so that the actual temperature of the semiconductor apparatus 110 and the actual temperature of the control device 120 correspond to each other.

The semiconductor system 100 in accordance with an embodiment of the present disclosure may control the actual temperature of the semiconductor apparatus 110 and the actual temperature of the control device 120 to correspond to each other, on the basis of the first temperature information INF_T1 of the semiconductor apparatus 110 and the second temperature information INF_T2 of the control device 120. Consequently, the semiconductor system 100 can substantially prevent an abnormal operation that occurs when the actual temperature of the semiconductor apparatus 110 and the actual temperature of the control device 120 do not correspond to each other, and minimize a decrease in operation efficiency.

Figure 2:
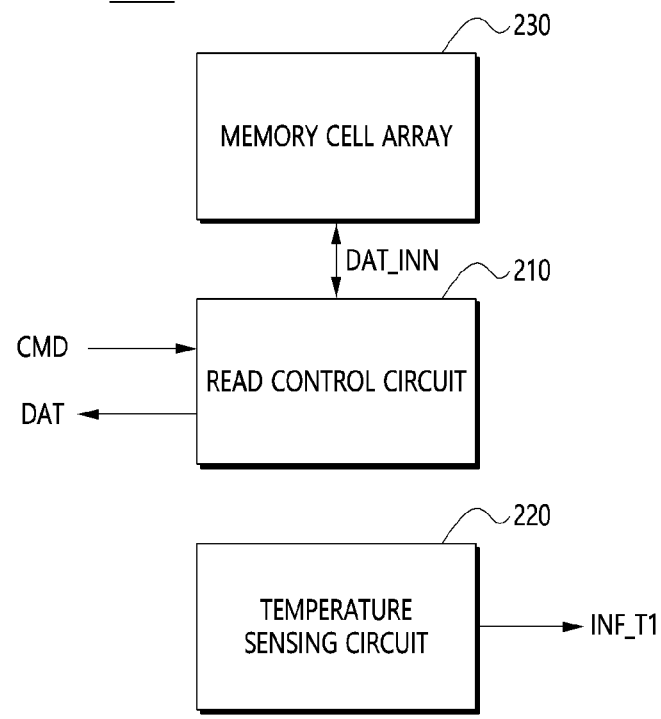
FIG. 2 is a block diagram illustrating an example of a configuration of a semiconductor apparatus in FIG. 1.

FIG. 2 is a block diagram illustrating an example of a configuration of the semiconductor apparatus 110 in FIG. 1. Hereinafter, for convenience of description, it is assumed that the semiconductor apparatus 110 is a semiconductor memory apparatus capable of performing a read operation.

Referring to FIG. 2, the semiconductor apparatus 110 may include a read control circuit 210 and a temperature sensing circuit 220.

First, the read control circuit 210 may be operable to control a read operation on the basis of the command signal CMD. The read control circuit 210 may control a read operation on data stored in a memory cell array 230, on the basis of the command signal CMD during a normal operation. Furthermore, the read control circuit 210 may control a read operation on arbitrary data on the basis of the command signal CMD during a temperature adjustment operation. The arbitrary data may include, for example, data stored in the memory cell array 230 or data generated by the read control circuit 210.

When the read control circuit 210 performs the read operation, the actual temperature of the semiconductor apparatus 110 may be increased. Furthermore, when the read control circuit 210 performs the deactivation operation, the actual temperature of the semiconductor apparatus 110 may be decreased. Furthermore, the read control circuit 210 may block a transfer path of data DAT connected to the control device 120 (see FIG. 1) in the read operation performed during the temperature adjustment operation. In other words, during the temperature adjustment operation, the transfer path of the data DAT, which is connected between the semiconductor apparatus 110 and the control device 120, may be blocked. In other words, the data DAT that is read during the temperature adjustment operation may not be provided to the control device 120.

Next, the temperature sensing circuit 220 may be operable to sense the actual temperature of the semiconductor apparatus 110 and output the sensed temperature as the first temperature information INF_T1. As described above, the semiconductor apparatus 110 may be a semiconductor memory apparatus capable of performing a read operation. Accordingly, the temperature sensing circuit 220 may sense the actual temperature of the semiconductor memory apparatus and output the first temperature information INF_T1 corresponding to the actual temperature.

Through the above configuration, the semiconductor apparatus 110 may control its own actual temperature during the temperature adjustment operation. In other words, the semiconductor apparatus 110 may increase its own actual temperature through the activation operation for the read operation during the temperature adjustment operation. Furthermore, the semiconductor apparatus 110 may decrease its own actual temperature through the deactivation operation for the read operation during the temperature adjustment operation.

The semiconductor system 100 in accordance with an embodiment of the present disclosure may control the actual temperature of the semiconductor apparatus 110 through the temperature adjustment operation.

Meanwhile, the read control circuit 210 may include various circuits such as a control circuit for controlling the read operation and a driving circuit. Furthermore, the read control circuit 210 may include an error correction circuit. The error correction circuit may perform an error correction operation. The error correction operation may be an operation of detecting an error for data stored in the semiconductor memory apparatus, and correcting the error. Accordingly, when the error correction operation of the error correction circuit is being performed, the actual temperature of the semiconductor apparatus 110 may be increased. When the error correction operation of the error correction circuit is not being performed, the actual temperature of the semiconductor apparatus 110 may be decreased. In other words, the semiconductor system 100 in accordance with an embodiment of the present disclosure may control the actual temperature of the semiconductor apparatus 110 according to whether the error correction operation of the error correction circuit is performed.

The read control circuit 210 may perform the error correction operation as a part of the temperature adjustment operation. In other words, the read control circuit 210 may perform the error correction operation in order to increase the actual temperature of the semiconductor apparatus 110, but the error correction operation on data stored in the memory cell array 230 may also be performed. In the semiconductor system 100 in accordance with an embodiment of the present disclosure, during the temperature adjustment operation, error correction may be additionally performed on data stored in the memory cell array 230.

Figure 3:
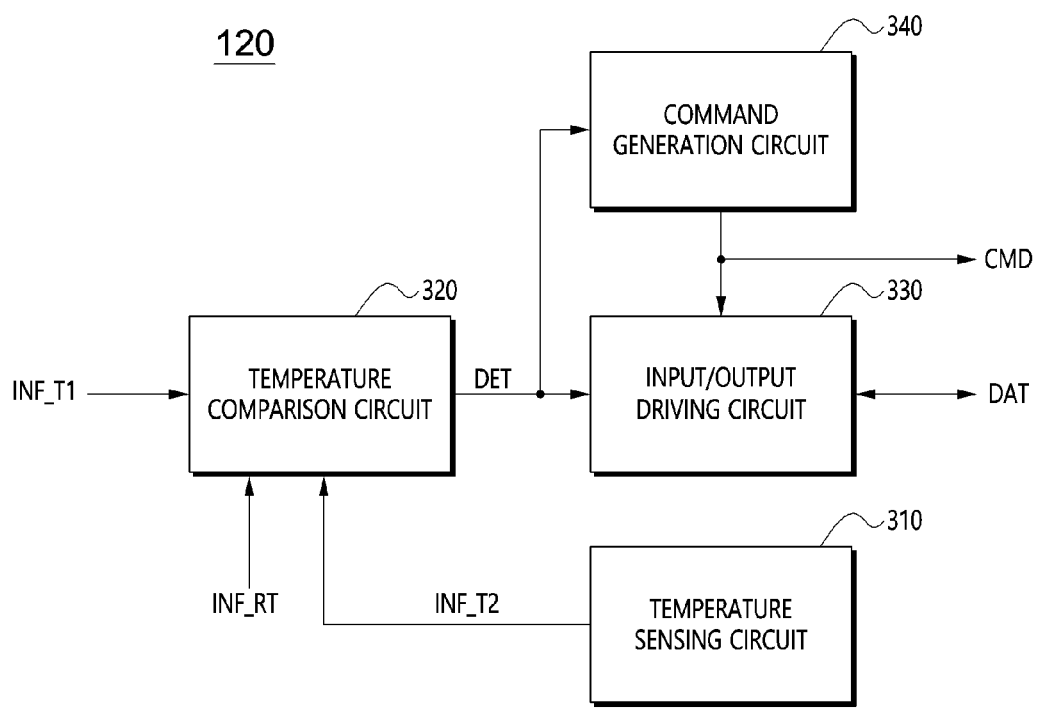
FIG. 3 is a block diagram illustrating an example of a configuration of a control device in FIG. 1.

FIG. 3 is a block diagram illustrating an example of a configuration of the control device 120 in FIG. 1.

Referring to FIG. 3, the control device 120 may include a temperature sensing circuit 310, a temperature comparison circuit 320, an input/output driving circuit 330, and a command generation circuit 340.

First, the temperature sensing circuit 310 may be operable to sense the temperature of the control device 120 and output the sensed temperature as the second temperature information INF_T2.

Next, the temperature comparison circuit 320 may be operable to generate a detection signal DET by comparing the first temperature information INF_T1 and the second temperature information INF_T2. The temperature comparison circuit 320 may receive reference temperature information INF_RT and compare the first temperature information INF_T1 and the second temperature information INF_T2. The relationship among the reference temperature information INF_RT and the first and second temperature information INF_T1 and INF_T2 and the comparison operation thereof will be described in detail with reference to FIG. 4.

Next, the input/output driving circuit 330 may be operable to perform at least one of an input driving operation and an output driving operation on the basis of the detection signal DET. The input/output driving circuit 330 may include an input circuit (not illustrated) and an output circuit (not illustrated). The input/output driving circuit 330 may perform a read operation of receiving the data DAT and perform a write operation of outputting the data DAT on the basis of the command signal CMD during the normal operation. Furthermore, the input/output driving circuit 330 may perform the input driving operation and the output driving operation on arbitrary data on the basis of the detection signal DET during the temperature adjustment operation.

When the input/output driving circuit 330 performs the input driving operation and/or the output driving operation, the actual temperature of the control device 120 may be increased. Furthermore, when the input/output driving circuit 330 performs the deactivation operation, the actual temperature of the control device 120 may be decreased. In the input driving operation and/or the output driving operation performed during the temperature adjustment operation, the input/output driving circuit 330 may block the transfer path of the data DAT, which is connected to the semiconductor apparatus 110 (FIG. 1). In other words, during the temperature adjustment operation, the transfer path of the data DAT, which is connected between the control device 120 and the semiconductor apparatus 110, may be blocked.

Next, the command generation circuit 340 may be operable to generate the command signal CMD on the basis of the detection signal DET. Here, the command generation circuit 340 may control, for example, the read operation of the semiconductor apparatus 110 including the semiconductor memory apparatus during the temperature adjustment operation on the basis of the command signal CMD. The command generation circuit 340 may generate the command signal CMD for the read operation of the semiconductor apparatus 110 and the read operation of the input/output driving circuit 330 during the normal operation as well.

Through the above configuration, the control device 120 may control its own actual temperature during a temperature adjustment operation. In other words, the control device 120 may increase its own actual temperature through an activation operation for an input driving operation and/or an output driving operation during the temperature adjustment operation. Furthermore, the control device 120 may decrease its own actual temperature through a deactivation operation for an input driving operation and/or an output driving operation. Furthermore, the control device 120 may increase or decrease the actual temperature of the semiconductor apparatus 110 through the read operation of the semiconductor apparatus 110 during a temperature adjustment operation.

The semiconductor system 100 in accordance with an embodiment of the present disclosure may control the actual temperature of the semiconductor apparatus 110 and the actual temperature of the control device 120 during the temperature adjustment operation.

Meanwhile, the input/output driving circuit 330 may include an error correction circuit (not illustrated) like the read control circuit 210 in FIG. 2. Accordingly, when an error correction operation of the error correction circuit is being performed, the actual temperature of the control device 120 may be increased. However, when the error correction operation of the error correction circuit is not being performed, the actual temperature of the control device 120 may be decreased. In other words, the semiconductor system 100 in accordance with an embodiment of the present disclosure may control the actual temperature of the control device 120 according to whether the error correction operation of the error correction circuit is performed.

Figure 4:
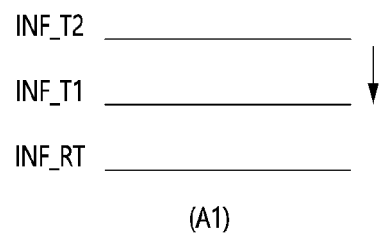
FIG. 4 is a conceptual diagram illustrating an example of a temperature adjustment operation according to reference temperature information and first and second temperature information in FIG. 3.
Figure 4:
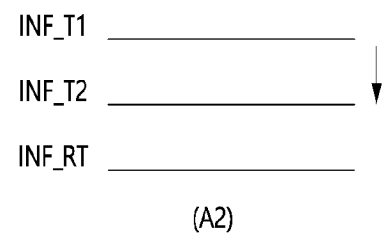
Figure 4:
Figure 4:
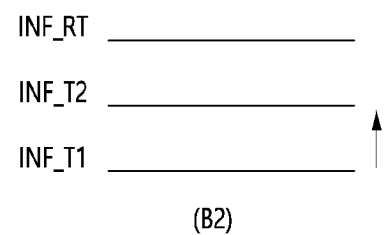
Figure 4:
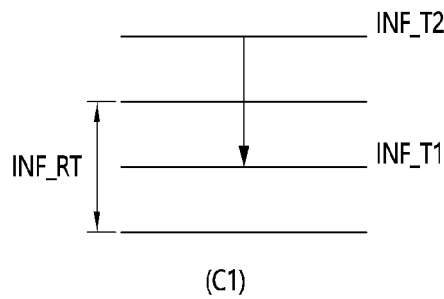
Figure 4:
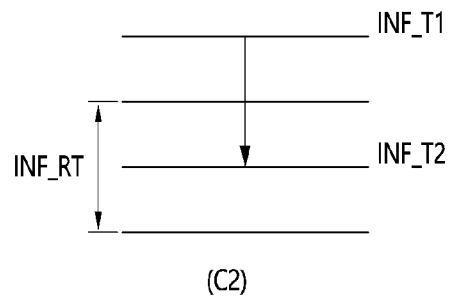
Figure 4:
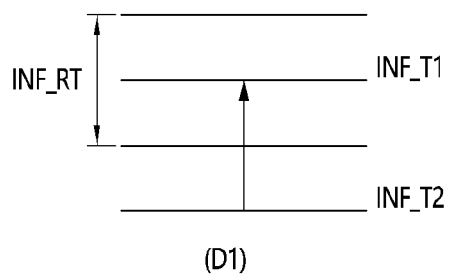
Figure 4:
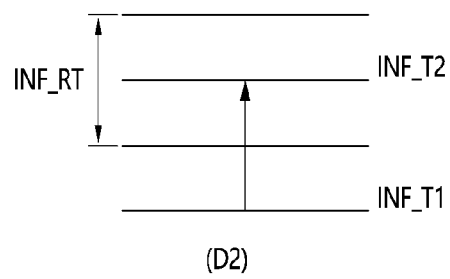

FIG. 4 is a conceptual diagram illustrating examples of a temperature adjustment operation according to the reference temperature information INF_RT and the first and second temperature information INF_T1 and INF_T2 in FIG. 3.

First, (A1), (A2), (B1), and (B2) of FIG. 4 may illustrate a case where the temperature comparison circuit 320 in FIG. 3 receives the reference temperature information INF_RT and performs a comparison operation. In such a case, the temperature comparison circuit 320 may generate the detection signal DET on the basis of temperature information, which is close to the reference temperature information INF_RT, between the first temperature information INF_T1 and the second temperature information INF_T2.

(A1) of FIG. 4 may illustrate a case where the first temperature information INF_T1 and the second temperature information INF_T2 are higher than the reference temperature information INF_RT and the second temperature information INF_T2 is higher than the first temperature information INF_T1. In other words, the actual temperature of the control device 120 corresponding to the second temperature information INF_T2 may be higher than the actual temperature of the semiconductor apparatus 110 corresponding to the first temperature information INF_T1. In such a case, the temperature comparison circuit 320 in FIG. 3 may generate the detection signal DET on the basis of the first temperature information INF_T1, which is closer to the reference temperature information INF_RT among the first temperature information INF_T1 and the second temperature information INF_T2. In (A1) of FIG. 4, since the second temperature information INF_T2 is higher than the first temperature information INF_T1, the semiconductor system 100 may perform a temperature adjustment operation for decreasing the second temperature information INF_T2. In other words, the input/output driving circuit 330 in FIG. 3 may perform a deactivation operation on the basis of the detection signal DET. As a consequence, the temperature of the control device 120 may be decreased. Consequently, the second temperature information INF_T2 corresponding to the actual temperature of the control device 120 may be decreased in the direction of the first s temperature information INF_T1.

(A2) of FIG. 4 may illustrate a case where the first temperature information INF_T1 and the second temperature information INF_T2 are higher than the reference temperature information INF_RT and the first temperature information INF_T1 is higher than the second temperature information INF_T2. In other words, the actual temperature of the semiconductor apparatus 110 corresponding to the first temperature information INF_T1 may be higher than the actual temperature of the control device 120 corresponding to the second temperature information INF_T2. In such a case, the temperature comparison circuit 320 in FIG. 3 may generate the detection signal DET on the basis of the second temperature information INF_T2, which is closer to the reference temperature information INF_RT among the first temperature information INF_T1 and the second temperature information INF_T2. In (A2) of FIG. 4, since the first temperature information INF_T1 is higher than the second temperature information INF_T2, the semiconductor system 100 may perform a temperature adjustment operation for decreasing the first temperature information INF_T1. In other words, the command generation circuit 340 in FIG. 3 may generate the command signal CMD on the basis of the detection signal DET, and the read control circuit 210 in FIG. 2 may perform a deactivation operation on the basis of the command signal CMD. As a consequence, the temperature of the semiconductor apparatus 110 may be decreased. Consequently, the first temperature information INF_T1 corresponding to the actual temperature of the semiconductor apparatus 110 may be decreased in the direction of the second temperature information INF_T2.

(B1) of FIG. 4 may illustrate a case where the first temperature information INF_T1 and the second temperature information INF_T2 are lower than the reference temperature information INF_RT and the second temperature information INF_T2 is lower than the first temperature information INF_T1. In such a case, the temperature comparison circuit 320 in FIG. 3 may generate the detection signal DET on the basis of the first temperature information INF_T1, which is closer to the reference temperature information INF_RT among the first temperature information INF_T1 and the second temperature information INF_T2. In (B1) of FIG. 4, since the second temperature information INF_T2 is lower than the first temperature information INF_T1, the semiconductor system 100 may perform a temperature adjustment operation for increasing the second temperature information INF_T2. In other words, the input/output driving circuit 330 in FIG. 3 may perform an input driving operation and an output driving operation on the basis of the detection signal DET. As a consequence, the temperature of the control device 120 may be increased. Consequently, the second temperature information INF_T2 corresponding to the actual temperature of the control device 120 may be increased in the direction of the first temperature information INF_T1.

(B2) of FIG. 4 may illustrate a case where the first temperature information INF_T1 is lower than the second temperature information INF_T2. In such a case, the semiconductor system 100 may perform a temperature adjustment operation for increasing the first temperature information INF_T1. In other words, the command generation circuit 340 in FIG. 3 may generate the command signal CMD on the basis of the detection signal DET, and the read control circuit 210 in FIG. 2 may perform a read operation on the basis of the command signal CMD. As a consequence, the temperature of the semiconductor apparatus 110 may be increased. Consequently, the first temperature information INF_T1 corresponding to the actual temperature of the semiconductor apparatus 110 may be increased in the direction of the second temperature information INF_T2.

Next, (C1), (C2), (D1), and (D2) of FIG. 4 may illustrate a case where the reference temperature information INF_RT may have a predetermined range. In other words, the temperature comparison circuit 320 in FIG. 3 may receive the reference temperature information INF_RT having a predetermined range and perform a comparison operation. In such a case, the temperature comparison circuit 320 may generate the detection signal DET on the basis of temperature information among the first temperature information INF_T1 and the second temperature information INF_T2 included in the predetermined range of the reference temperature information INF_RT.

(C1) of FIG. 4 may illustrate a case where the first temperature information INF_T1 is included in the predetermined range of the reference temperature information INF_RT. In such a case, the temperature comparison circuit 320 in FIG. 3 may generate the detection signal DET on the basis of the first temperature information INF_T1. In (C1) of FIG. 4, the second temperature information INF_T2 may be higher than the first temperature information INF_T1. Accordingly, the semiconductor system 100 may perform a temperature adjustment operation for decreasing the second temperature information INF_T2 in the direction of the first temperature information INF_T1.

(C2) of FIG. 4 may illustrate a case where the second temperature information INF_T2 is included in the predetermined range of the reference temperature information INF_RT. In such a case, the temperature comparison circuit 320 in FIG. 3 may generate the detection signal DET on the basis of the second temperature information INF_T2. In (C2) of FIG. 4, the first temperature information INF_T1 may be higher than the second temperature information INF_T2. Accordingly, the semiconductor system 100 may perform a temperature adjustment operation for decreasing the first temperature information INF_T1 in the direction of the second temperature information INF_T2.

(D1) of FIG. 4 may illustrate a case where the first temperature information INF_T1 is included in the predetermined range of the reference temperature information INF_RT. In such a case, the second temperature information INF_T2 may be lower than the first temperature information INF_T1. Accordingly, the semiconductor system 100 may perform a temperature adjustment operation for increasing the second temperature information INF_T2 in the direction of the first temperature information INF_T1.

(D2) of FIG. 4 may illustrate a case where the second temperature information INF_T2 is included in the predetermined range of the reference temperature information INF_RT. In such a case, the first temperature information INF_T1 may be lower than the second temperature information INF_T2. Accordingly, the semiconductor system 100 may perform a temperature adjustment operation for increasing the first temperature information INF_T1 in the direction of the second temperature information INF_T2.

Figure 5:
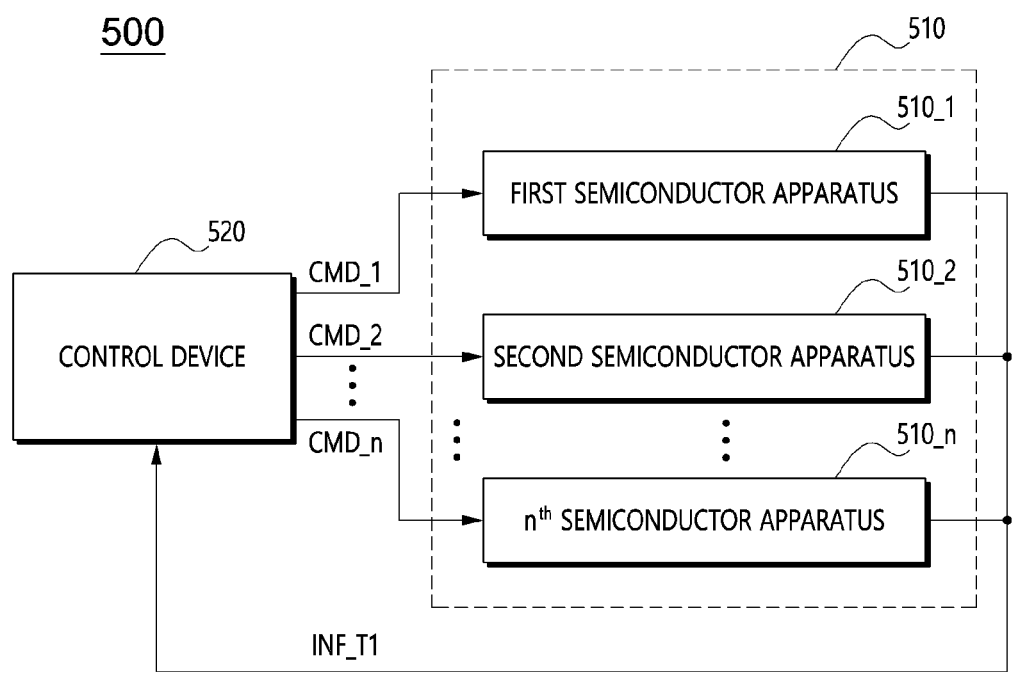
FIG. 5 is a block diagram illustrating an example of a semiconductor system in accordance with an embodiment of the present disclosure.

FIG. 5 is a block diagram illustrating an example of a semiconductor system 500 in accordance with an embodiment of the present disclosure.

Referring to FIG. 5, the semiconductor system 500 may include a plurality of semiconductor apparatuses 510 and a control device 520.

First, the plurality of semiconductor apparatuses 510 may receive command signals CMD_1 to CMD_n (n being a natural number equal to or greater than 2), respectively. FIG. 5 illustrates an example in which the number of the plurality of semiconductor apparatuses 510 is n. In other words, the plurality of semiconductor apparatuses 510 may include first to $n^{th}$ semiconductor apparatuses 510_1 to 510_n. The first to $n^{th}$ semiconductor apparatuses 510_1 to 510_n may receive first to $n^{th}$ command signals CMD_1 to CMD_n, respectively, and perform preset operations. For instance, each of the first to $n^{th}$ semiconductor apparatuses 510_1 to 510_n in FIG. 5 may correspond to the semiconductor apparatus 110 in FIG. 1.

Next, the control device 520 may be operable to control a temperature adjustment operation for each of the plurality of semiconductor apparatuses 510 on the basis of first temperature information INF_T1 provided from each of the plurality of semiconductor apparatuses 510. The control device 520 in FIG. 5 may correspond to the control device 120 in FIG. 1. Accordingly, the control device 520 may control not only a temperature adjustment operation for each of the plurality of semiconductor apparatuses 510, but also a temperature adjustment operation for the control device 520.

The first temperature information INF_T1 may include information corresponding to actual temperature of each of the plurality of semiconductor apparatuses 510. Furthermore, the first temperature information INF_T1 may include information for identifying each of the plurality of semiconductor apparatuses 510. In other words, among the plurality of semiconductor apparatuses 510, the first semiconductor apparatus 510_1 may output, as the first temperature information INF_T1, information for identifying the first semiconductor apparatus 510_1 together with information corresponding to the actual temperature of the first semiconductor apparatus 510_1. Furthermore, the $n^{th}$ semiconductor apparatus 510_n may output, as the first temperature information INF_T1, information corresponding to the actual temperature of the $n^{th}$ semiconductor apparatus 510_n and information for identifying the $n^{th}$ semiconductor apparatus 510_n.

For reference, FIG. 5 illustrates an example in which information corresponding to the actual temperature of each of the first to $n^{th}$ semiconductor apparatuses 510_1 to 510_n and information for identifying each of the first to n th semiconductor apparatuses 510_1 to 510_n are time-divided through the first temperature information INF_T1 and transmitted to the control device 520. In other words, the temperature information and identification information for the first to $n^{th}$ semiconductor apparatuses 510_1 to 510_n can be transmitted on the same transmission line or signal at different times. In some implementations, the semiconductor system 500 in accordance with the present embodiment may transmit the first temperature information INF_T1 of each of the first to $n^{th}$ semiconductor apparatuses 510_1 to 510_n to the control device 520 through a plurality of transmission lines (not illustrated) connected in parallel.

As described above, the first to $n^{th}$ semiconductor apparatuses 510_1 to 510_n and the control device 520 may have different temperatures depending on operation conditions. In such a case, the control device 520 may control a temperature adjustment operation for any of the first to $n^{th}$ semiconductor apparatuses 510_1 to 510_n and the control device 520 on the basis of the first temperature information INF_T1 of each of the first to $n^{th}$ semiconductor apparatuses 510_1 to 510_n and second temperature information INF_T2 of the control device 520 to be described below. As described with reference to FIG. 1, the temperature adjustment operation may be an operation for allowing the first temperature information INF_T1 and the second temperature information INF_T2 to correspond to each other. Accordingly, the semiconductor system 500 may control the actual temperature of each of the first to $n^{th}$ semiconductor apparatuses 510_1 to 510_n and/or the actual temperature of the control device 520 to correspond to each other through the temperature adjustment operation.

The semiconductor system 500 in accordance with the present embodiment may control the actual temperature of each of the plurality of semiconductor apparatuses 510 and/or the actual temperature of the control device 520 to correspond to each other through a temperature adjustment operation.

Figure 6:
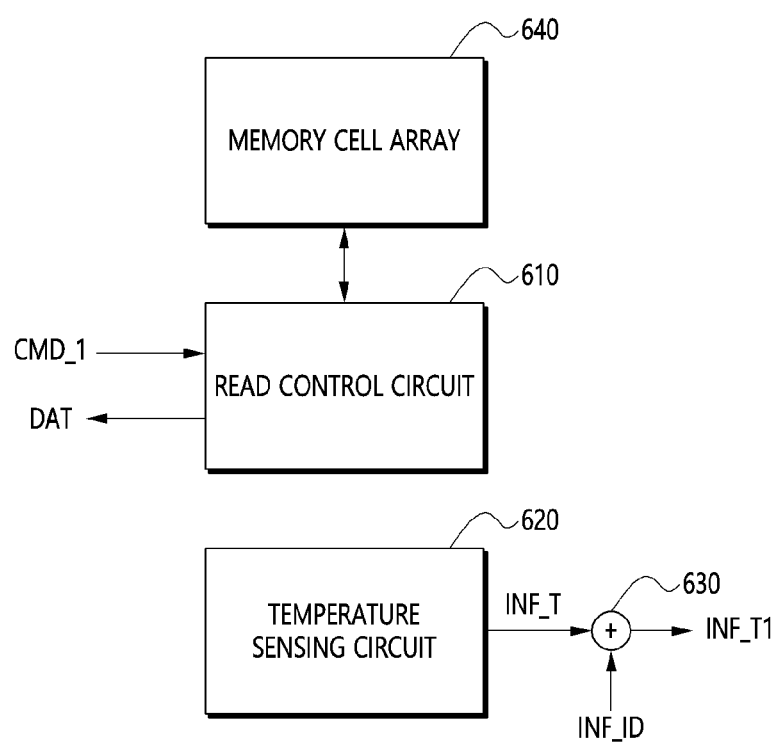
FIG. 6 is a block diagram illustrating an example of a configuration of a plurality of semiconductor apparatuses in FIG. 5.

FIG. 6 is a block diagram illustrating an example of a configuration of the plurality of semiconductor apparatuses 510 in FIG. 5. For convenience of description, FIG. 6 representatively illustrates the first semiconductor apparatus 510_1 among the first to $n^{th}$ semiconductor apparatuses 510_1 to 510_n which are the plurality of semiconductor apparatuses 510. FIG. 6 illustrates an example in which the first semiconductor apparatus 510_1 is a semiconductor memory apparatus capable of performing a read operation.

Referring to FIG. 6, the first semiconductor apparatus 510_1 s may include a read control circuit 610, a temperature sensing circuit 620, and an information combining circuit 630.

First, the read control circuit 610 may be operable to control a read operation on the basis of a first command signal CMD_1. The read control circuit 610 may control a read operation on data stored in a memory cell array 640, during a normal operation. Furthermore, the read control circuit 610 may control a read operation on arbitrary data during a temperature adjustment operation. The arbitrary data may include, for example, data stored in the memory cell array 640 or data generated by the read control circuit 610. When the read is control circuit 610 performs the read operation, the actual temperature of the first semiconductor apparatus 510_1 may be increased.

Next, the temperature sensing circuit 620 may be operable to sense the actual temperature of the first semiconductor apparatus zo 510_1 and output the sensed temperature as temperature information INF_T. As described above, the first semiconductor apparatus 510_1 may be a semiconductor memory apparatus capable of performing a read operation. Accordingly, the temperature sensing circuit 620 may sense the temperature of the semiconductor memory apparatus and output the sensed temperature as the temperature information INF_T.

Next, the information combining circuit 630 may be operable to output the first temperature information INF_T1 by combining identification information INF_ID corresponding to the first semiconductor apparatus 510_1 with the temperature information INF_T. For example, identification information INF_ID can be time-multiplexed or concatenated with the temperature information INF_T to generate the first temperature information INF_T1. Identification information INF_ID can also be added with the temperature information INF_T to generate the first temperature information INF_T1. The utilization of the identification information INF_ID combined with the first temperature information INF_T1 will be described with reference to FIG. 7.

Through the above configuration, the first semiconductor apparatus 510_1 may control its own actual temperature during a temperature adjustment operation. In other words, the first semiconductor apparatus 510_1 may increase its own actual temperature through an activation operation for a read operation during the temperature adjustment operation. Furthermore, the first semiconductor apparatus 510_1 may decrease its own actual temperature through a deactivation operation for the read operation during the temperature adjustment operation.

The semiconductor system 500 in accordance with an embodiment of the present disclosure may control the actual temperature of the first semiconductor apparatus 510_1 through a temperature adjustment operation. In other words, the semiconductor system 500 may control the actual temperature of any of the first to $n^{th}$ semiconductor apparatuses 510_1 to 510_n through the temperature adjustment operation.

Figure 7:
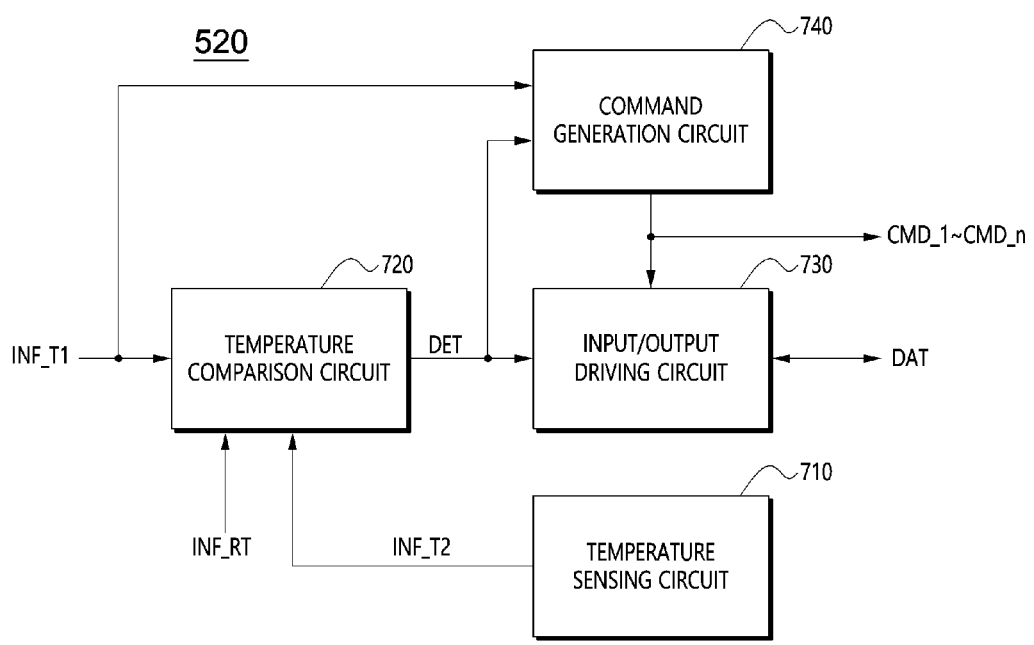
FIG. 7 is a block diagram illustrating an example of a configuration of a control device in FIG. 5.

FIG. 7 is a block diagram illustrating an example of a configuration of the control device 520 in FIG. 5.

Referring to FIG. 7, the control device 520 may include a temperature sensing circuit 710, a temperature comparison circuit 720, an input/output driving circuit 730, and a command generation circuit 740.

First, the temperature sensing circuit 710 may be operable to sense the temperature of the control device 520 and output the sensed temperature as the second temperature information INF_T2.

Next, the temperature comparison circuit 720 may be operable to generate a detection signal DET by comparing the first temperature information INF_T1 and the second temperature information INF_T2. The temperature comparison circuit 720 may receive reference temperature information INF_RT and compare the first temperature information INF_T1 and the second temperature information INF_T2. Since the relationship among the reference temperature information INF_RT and the first and second temperature information INF_T1 and INF_T2 and the comparison operation thereof have already been described with reference to FIG. 4, a description thereof need not be repeated.

Next, the input/output driving circuit 730 may be operable to perform at least one of an input driving operation and an output driving operation on the basis of the detection signal DET. The input/output driving circuit 730 may include an input circuit (not illustrated) and an output circuit (not illustrated). The input/output driving circuit 730 may perform a read operation of receiving data DAT and perform a write operation of outputting the data DAT on the basis of the first command signal CMD_1 during a normal operation. Furthermore, the input/output driving circuit 730 may perform the input driving operation and/or the output driving operation on arbitrary data on the basis of the detection signal DET during the temperature adjustment operation. When the input/output driving circuit 730 performs the input driving operation and/or the output driving operation, the actual temperature of the control device 520 may be increased. Furthermore, when the input/output driving circuit 730 performs the deactivation operation, the actual temperature of the control device 520 may be decreased.

Next, the command generation circuit 740 may be operable to generate the plurality of command signals CMD_1 to CMD_n, which correspond to the plurality of semiconductor apparatuses 510 (see FIG. 5), respectively, on the basis of the first temperature information INF_T1 and the detection signal DET. Here, the command generation circuit 740 may generate the first to n$^{th}$ command signals CMD_1 to CMD_n, which correspond to the first to n$^{th}$ semiconductor apparatuses 510_1 to 510_n, respectively, which are the plurality of semiconductor apparatuses 510. Here, the command generation circuit 740 may generate the first to nth command signals CMD_1 to CMD_n on the basis of the identification information INF_ID included in the first temperature information INF_T1 during the temperature adjustment operation. Accordingly, the first to n$^{th}$ semiconductor apparatuses 510_1 to 510_n may perform read operations based on the temperature adjustment operation on the basis of the first to nth command signals CMD_1 to CMD_n, respectively.

Through such a configuration, the semiconductor system 500 in accordance with an embodiment of the present disclosure may control the actual temperature of each of the plurality of semiconductor apparatuses 510 and the actual temperature of the control device 520.

Figure 8:
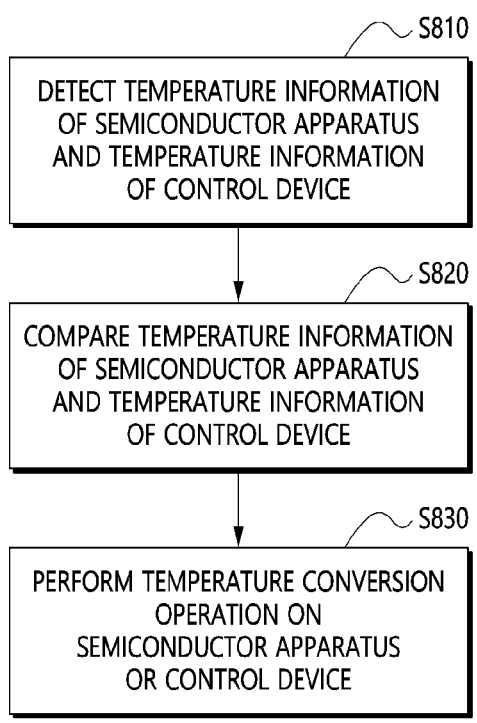
FIG. 8 is a flowchart illustrating an example of an operating method of the semiconductor system in accordance with an embodiment of the present disclosure.

FIG. 8 is a flowchart illustrating an operating method 800 of the semiconductor system in accordance with an embodiment of the present disclosure. For convenience of description, the operating method will be described on the basis of the semiconductor system 100 in FIG. 1.

Referring to FIG. 1 and FIG. 8, the operating method 800 of the semiconductor system 100 may include a step S810 of detecting temperature information of the semiconductor apparatus 110 and temperature information of the control device 120, a step S820 of comparing the temperature information of the semiconductor apparatus 110 and the temperature information of the control device 120, and a step S830 of performing a temperature adjustment operation on the semiconductor apparatus 110 or the control device 120.

First, the step S810 of detecting the temperature information of the semiconductor apparatus 110 and the temperature information of the control device 120 may be a step of detecting the first temperature information INF_T1 corresponding to the actual temperature of the semiconductor apparatus 110 and the second temperature information INF_T2 corresponding to the actual temperature of the control device 120. The step S810 of detecting the temperature information of the semiconductor apparatus 110 and the temperature information of the control device 120 may be performed by the temperature sensing circuit 220 in FIG. 2 and the temperature sensing circuit 310 in FIG. 3. The temperature sensing circuit 220 in FIG. 2 may output the first temperature information INF_T1 corresponding to the actual temperature of the semiconductor apparatus 110. The temperature sensing circuit 310 in FIG. 3 may output the second temperature information INF_T2 corresponding to the actual temperature of the control device 120.

Next, the step S820 of comparing the temperature information of the semiconductor apparatus 110 and the temperature information of the control device 120 may be a step of comparing the first temperature information INF_T1 corresponding to the semiconductor apparatus 110 and the second temperature information INF_T2 corresponding to the control device 120. The step S820 of comparing the temperature information of the semiconductor apparatus 110 and the temperature information of the control device 120 may be performed by the temperature comparison circuit 320 in FIG. 3. The temperature comparison circuit 320 in FIG. 3 may generate the detection signal DET by comparing the first temperature information INF_T1 and the second temperature information INF_T2.

Next, the step S830 of performing the temperature adjustment operation on the semiconductor apparatus 110 or the control device 120 may be a step of performing the temperature adjustment operation on at least one of the semiconductor apparatus 110 and the control device 120 so that the actual temperature of the semiconductor apparatus 110 and the actual temperature of the control device 120 correspond to each other. The step S830 of performing the temperature adjustment operation on the semiconductor apparatus 110 or the control device 120 may be performed by the read control circuit 210 in FIG. 2 and the input/output driving circuit 330 in FIG. 3. The read control circuit 210 in FIG. 2 may perform a read operation on the basis of the command signal CMD generated according to the detection signal DET. The actual temperature of the semiconductor apparatus 110 may be controlled through the read operation performed in this way. Furthermore, the input/output driving circuit 330 in FIG. 3 may perform an input driving operation and/or an output driving operation on the basis of the detection signal DET. The actual temperature of the control device 120 may be controlled through the input driving operation and/or the output driving operation performed in this way.

The operating method 800 of the semiconductor system in accordance with an embodiment of the present disclosure may control the actual temperature of the semiconductor apparatus 110 and the actual temperature of the control device 120 to correspond to each other.

What is claimed is:

1. A semiconductor system comprising:
a semiconductor apparatus operable to perform a preset operation in response to a command signal; and
a control device operable to control a temperature adjustment operation for at least one of the control device or the semiconductor apparatus on the basis of an actual temperature of the semiconductor apparatus and an actual temperature of the control device so that the actual temperature of the semiconductor apparatus and the actual temperature of the control device correspond to each other,
wherein the control device performs the temperature adjustment operation for increasing the actual temperature of the control device when the actual temperature of the control device is lower than the actual temperature of the semiconductor apparatus.

2. The semiconductor system according to claim 1, wherein the temperature adjustment operation includes at least one of an activation operation, a read operation, an input driving operation, an output driving operation, or a deactivation operation.

3. The semiconductor system according to claim 1, wherein the semiconductor apparatus includes a semiconductor memory apparatus that is operable to perform a read operation, and
the semiconductor memory apparatus comprises:
a read control circuit operable to control the read operation on the basis of the command signal; and
a temperature sensing circuit operable to sense the actual temperature of the semiconductor memory apparatus and output the sensed actual temperature as the first temperature information.

4. The semiconductor system according to claim 3, wherein the read control circuit is operable to control the read operation on data stored in a memory cell array during a normal operation, and control the read operation on arbitrary data during the temperature adjustment operation.

5. The semiconductor system according to claim 1, wherein the control device comprises:
a temperature sensing circuit operable to sense the actual temperature of the control device and output the sensed actual temperature as the second temperature information;
a temperature comparison circuit operable to generate a detection signal by comparing the first temperature information and the second temperature information;
an input/output driving circuit operable to perform at least one driving operation of an input driving operation or an output driving operation on the basis of the detection signal; and
a command generation circuit operable to generate the command signal on the basis of the detection signal.

6. The semiconductor system according to claim 5, wherein the input/output driving circuit is operable to perform a read operation or a write operation on data on the basis of the command signal during a normal operation, and perform an input driving operation or an output driving operation on arbitrary data on the basis of the detection signal during the temperature adjustment operation.

7. The semiconductor system according to claim 5, wherein the temperature comparison circuit is operable to generate the detection signal on the basis of temperature information among the first temperature information and the second temperature information that is closer to reference temperature information.

8. The semiconductor system according to claim 5, wherein the temperature comparison circuit is operable to receive reference temperature information having a predetermined range, and generate the detection signal on the basis of temperature information among the first temperature information and the second temperature information, which is included in the predetermined range.

9. The semiconductor system according to claim 1, wherein during the temperature adjustment operation, a data transfer path connected between the semiconductor apparatus and the control device is blocked.

10. The semiconductor system according to claim 1, wherein at least one of the semiconductor apparatus and the control device includes an error correction circuit, and the error correction circuit is operable to control the actual temperature of the semiconductor apparatus or the actual temperature of the control device according to whether an error correction operation is performed.

11. The semiconductor system according to claim 1, wherein the semiconductor apparatus is one of a plurality of the semiconductor apparatuses each receiving the command signal, and
the control device is operable to control the temperature adjustment operation for each of the plurality of semiconductor apparatuses on the basis of first temperature information provided from each of the plurality of semiconductor apparatuses.

12. The semiconductor system according to claim 11, wherein the first temperature information includes information corresponding to an actual temperature of each of the plurality of semiconductor apparatuses and information for identifying each of the plurality of semiconductor apparatuses.

13. The semiconductor system according to claim 11, wherein the plurality of semiconductor apparatuses include a plurality of semiconductor memory apparatuses that are operable to perform read operations, and
each of the plurality of semiconductor memory apparatuses comprises:
a read control circuit operable to control the read operation on the basis of the command signal;
a temperature sensing circuit operable to sense an actual temperature of a corresponding semiconductor memory apparatus and output the sensed temperature as temperature information; and
an information combining circuit operable to output the first temperature information by combining identification information corresponding to the corresponding semiconductor memory apparatus with the temperature information.

14. The semiconductor system according to claim 13, wherein the control device comprises:
a temperature sensing circuit operable to sense the actual temperature of the control device and output the sensed temperature as the second temperature information;
a temperature comparison circuit operable to generate a detection signal by comparing the first temperature information and the second temperature information;
an input/output driving circuit operable to perform at least one driving operation of an input driving operation and an output driving operation on the basis of the detection signal; and
a command generation circuit operable to generate a plurality of command signals, which correspond to the plurality of semiconductor apparatuses, respectively, on the basis of the first temperature information and the detection signal.

15. An operating method of a semiconductor system, the operating method comprising:
- a step of detecting an actual temperature of a semiconductor apparatus and an actual temperature of a control device;
- a step of comparing the actual temperature of the semiconductor apparatus and the actual temperature of the control device; and
- a step of increasing the actual temperature of one of the semiconductor apparatus and the control device, which has lower temperature information than the other, by performing a temperature adjustment operation on the one of the semiconductor apparatus and the control device so that the actual temperature of the semiconductor apparatus and the actual temperature of the control device correspond to each other.

16. The operating method according to claim 15, wherein the temperature adjustment operation includes at least one of an activation operation, a read operation, an input driving operation, an output driving operation, a deactivation operation, or an error correction operation.

17. The operating method according to claim 16, wherein,
in step of detecting, the actual temperature of the semiconductor apparatus is outputted as first temperature information, and the actual temperature of the control device is outputted as second temperature information, and in the step of comparing, a comparison operation is performed on the basis of temperature information among the first temperature information and the second temperature information that is closer to reference temperature information.

18. The operating method according to claim 15, wherein,
in step of detecting, the actual temperature of the semiconductor apparatus is outputted as first temperature information, and the actual temperature of the control device is outputted as second temperature information, and
in the step of comparing, a comparison operation is performed on the basis of temperature information among the first temperature information and the second temperature information that is included in a predetermined range of reference temperature information.

19. The operating method according to claim 15, further comprising:
- a step of blocking a data transfer path connected between the semiconductor apparatus and the control device during the temperature adjustment operation.

20. A semiconductor system comprising:
- a semiconductor apparatus; and
- a control device operable to compare information an actual temperature of the semiconductor apparatus and an actual temperature of the control device,
wherein the control device controls a temperature adjustment operation of one of the semiconductor apparatus and the control device for increasing the actual temperature of the one which has lower temperature than the other so that the actual temperature of the semiconductor apparatus and the actual temperature of the control device correspond to each other.

\* \* \* \* \*